United States Patent
Tang et al.

(10) Patent No.: US 10,902,912 B2
(45) Date of Patent: Jan. 26, 2021

(54) ELECTROCHEMICAL SWITCHING DEVICE WITH PROTECTIVE ENCAPSULATION

(71) Applicant: INTERNATIONAL BUSINESS MACHINES CORPORATION, Armonk, NY (US)

(72) Inventors: Jianshi Tang, Elmsford, NY (US); John Rozen, Hastings on Hudson, NY (US); John A. Ott, Greenwood Lake, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/438,924

(22) Filed: Jun. 12, 2019

(65) Prior Publication Data

US 2020/0395069 A1    Dec. 17, 2020

(51) Int. Cl.
| | | |
|---|---|---|
| *G11C 13/00* | (2006.01) | |
| *H01L 27/24* | (2006.01) | |
| *H01G 9/08* | (2006.01) | |
| *H01G 9/04* | (2006.01) | |
| *H01G 9/035* | (2006.01) | |
| *H01M 10/0525* | (2010.01) | |
| *H01L 45/00* | (2006.01) | |

(52) U.S. Cl.
CPC ......... *G11C 13/0011* (2013.01); *H01G 9/035* (2013.01); *H01G 9/04* (2013.01); *H01G 9/08* (2013.01); *H01L 27/2463* (2013.01); *H01L 45/1253* (2013.01); *H01M 10/0525* (2013.01)

(58) Field of Classification Search
CPC ...... G11C 13/0011; H01G 9/035; H01G 9/04; H01G 9/08; H01L 27/2463; H01L 45/1253; H01M 10/0525
See application file for complete search history.

(56) References Cited

U.S. PATENT DOCUMENTS

| | | | |
|---|---|---|---|
| 7,382,647 B1 * | 6/2008 | Gopalakrishnan | ............................. G11C 13/0007 365/100 |
| 7,724,499 B2 * | 5/2010 | Lin | ................... H01L 29/78681 204/230.5 |
| 8,097,872 B2 * | 1/2012 | Kreupl | ............... G11C 13/0004 257/1 |
| 8,169,140 B2 | 5/2012 | Han | |
| 8,759,807 B2 | 6/2014 | Sandhu et al. | |

(Continued)

FOREIGN PATENT DOCUMENTS

| | | |
|---|---|---|
| CN | 103915565 A | 7/2014 |
| KR | 101263309 B1 | 5/2013 |
| WO | 2018057022 A1 | 3/2018 |

OTHER PUBLICATIONS

Tang, J. et al., "ECRAM as Scalable Synaptic Cell for High-Speed, Low-Power Neuromorphic Computing" 2018 IEEE International Electron Devices Meeting (Dec. 2018) pp. 1-4.

*Primary Examiner* — Tri M Hoang
(74) *Attorney, Agent, or Firm* — Tutunjian & Bitetto, P.C.; Randall Bluestone

(57) ABSTRACT

An electrochemical device includes an enclosure formed over a structure and defining an area between vertical portions of the enclosure. An electrochemical channel structure includes an electrolyte formed within the area wherein the electrolyte is protected from exposure on sidewalls of the electrolyte by the enclosure.

20 Claims, 8 Drawing Sheets

(56) References Cited

U.S. PATENT DOCUMENTS

| | | |
|---|---|---|
| 9,577,204 B1 | 2/2017 | Han et al. |
| 2017/0179382 A1 | 6/2017 | McCollum et al. |
| 2018/0026183 A1 | 1/2018 | Liu et al. |

* cited by examiner

ELECTROCHEMICAL SWITCHING DEVICE WITH PROTECTIVE ENCAPSULATION

BACKGROUND

The present invention generally relates to electrochemical switching devices, and more particularly to electrochemical devices with protection for electrolytic material of the devices.

Electrolytes, such as electrons or ions, can be intercalated into a material to alter the material's conductivity or charge. However, electrolytes for intercalation can be reactive with elements in air or with humidity. Due to this reactivity, the electrolyte can degrade when exposed to an environment. The degradation can harm the ability of the electrolyte to intercalate ions or electrons into the material.

SUMMARY

In accordance with embodiments of the present invention, an electrochemical device includes an enclosure formed over a structure and defining an area between vertical portions of the enclosure. An electrochemical channel structure includes an electrolyte formed within the area wherein the electrolyte is protected from exposure on sidewalls of the electrolyte by the enclosure.

Another electrochemical device includes a substrate having source/drain electrodes disposed thereon. A channel material is disposed over the substrate and the source/drain electrodes. An electrolyte is disposed on the channel material, and a gate electrode is disposed on the channel material. An enclosure at least partially encapsulates the electrolyte to protect the electrolyte from exposure on sidewalls of the electrolyte.

A method for forming an electrochemical device includes forming an enclosure to protect electrolyte material of an electrochemical device wherein the enclosure is disposed about the electrolyte material and covers at least vertical sidewalls of the electrolyte material; and protecting the electrochemical device from ambient materials using the enclosure.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
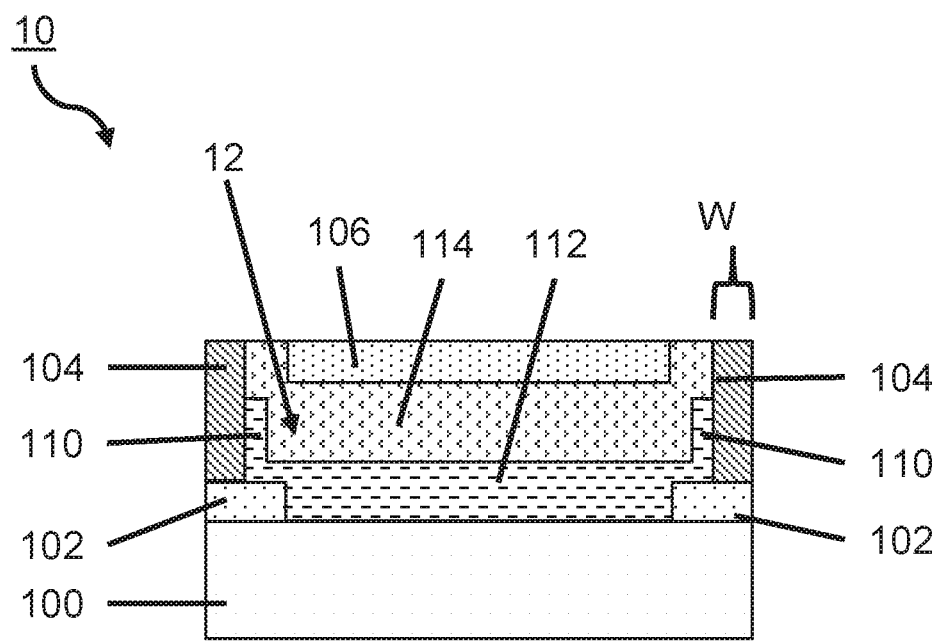
FIG. 1 is a cross-sectional view showing an electrochemical switching device with protective encapsulation in accordance with an embodiment of the present invention.

According to embodiments of the present invention, devices and methods are provided with a protection enclosure for electrochemical devices. The electrochemical device can be employed for reading and writing information using charge carrier intercalation. In useful embodiments, the charge carrier intercalation devices can include electrochemical random access memory (ECRAM) devices, which employ electrolytic materials. The electrolytic materials are encapsulated with a protective barrier to prevent degradation. The encapsulation or enclosure can include a number of techniques and structures that provide protection against degradation of the electrolytic material. The enclosure can include a complete or partial enclosure. The enclosure can be formed on the sides and/or top of the device. In some embodiments, the enclosure is formed prior to the formation of the electrochemical device. In other embodiments, the enclosure is formed after the electrochemical device.

Degradation of the electrolytic material can be the result of exposure to air, humidity or other reactive environments. Embodiments described herein can include forming an enclosure around the electrochemical device for protection. Embodiments for the enclosure described herein can include a dielectric encapsulation layer, sidewalls spacers, self-aligned spacers and/or other structures formed to protect exposed portions of the electrochemical device.

In one embodiment, an ECRAM device includes a protection barrier along sidewalls of the device. An ECRAM can include a gate atop a dielectric layer, which covers electrolytic materials. The electrolytic materials can include a lithium phosphorous oxynitride or other solid-state electrolyte. A device channel can include a tungsten trioxide although other suitable materials can be employed. The ECRAM is particularly useful as an artificial synapse device for neural network applications. To set a level of resistance, a synapse's weight in a neural network can be set by pulsing a current across the gate and source electrode of the ECRAM device. When the pulse is of one polarity, the pulse drives ions (e.g., Li ions) into the channel layer, making the device more conductive between source and drain electrodes. Reversing the polarity causes the ions to move back into the electrolyte material to reduce conductance.

Reading the synapse's weight is performed by setting a voltage across the source and drain electrodes and sensing the resulting current. The separation of the read current path from the write current path is one advantage of electrochemical devices. It should be understood that other embodiments can include electrochemical devices spanning between metal lines or contacts, e.g., between crossbars of a crossbar array. Exemplary applications/uses to which the present invention can be applied include, but are not limited to: electro-chemical devices, such as, e.g., electro-chemical random-access memory (ECRAM), electro-chemical transistors, batteries, capacitors, or any other device utilizing charge carrier intercalation with a reactive electrolyte. Note that electrolyte includes all films that can conduct ions and are electrical insulators and can therefore include a wide variety of dielectrics beyond standard ionic electrolytes used in energy devices (batteries, etc.).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a cross-sectional view of an electrochemical switching device 10 with spacer encapsulation using spacers 104 or with dielectric walls of a trench is depicted according to an embodiment of the present invention. The device 10 can include a substrate 100 that can include any suitable substrate structure, e.g., a bulk semiconductor, a semiconductor-on-insulator (SOI) substrate, etc. In one example, the substrate 100 can include a silicon-containing material. Illustrative examples of Si-containing materials suitable for the substrate 100 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc. In other embodiments, the substrate 100 can be replaced by a metal line, contact, a dielectric or any other useful structure or back-end component.

According to an embodiment of the present invention, a dielectric trench 12 (between spacers 104) is formed into which an electrochemical device 10 is formed. The structure can be formed over the substrate 100, formed on or over source and drain electrodes 102 and/or formed over other components.

If the device 10 is formed on a conducting substrate or layer, an insulating layer, e.g. SiN, SiO, etc. can be employed to isolate the substrate 100 and the source/drain regions 102. The dielectric layer (not shown) can be deposited or grown (e.g., an oxide) prior to the formation of the substrate 100 and source/drain electrodes 102. It should be noted that the device 10 can be fabricated in the back-end between metal layers in an array and form connections to other devices, other conductors and front-end logic.

In the illustrative embodiment shown, the structure includes a dielectric layer etched to form a trench 12 or side wall spacers 104 that are formed on or over the source and drain electrodes 102. The spacers 104 or sidewalls of trench 12 serve as encapsulation structure of the electrochemical device 10. The device 10 is formed inside the trench 12. A channel or channel material 112 is formed over the source and drain electrodes 102 and the substrate 100. In one embodiment, the channel 112, which can include, e.g., $WO_3$, which can be conformally formed and recessed.

Recessed portions 110 can be formed prior to deposition of an electrolyte 114 and can be used to avoid shorts between the source and drain electrodes 102 and the electrolyte 114. In one embodiment, the recess of channel material 112 can be formed be conformally depositing the channel material 112 in the trench 12 followed by a dummy fill (e.g., an organic planarizing layer (OPL) over the channel material 112 and a recess of the dummy fill to a desired height. Then, the channel material 112 is etched (e.g., RIE) to or below the desired height (to recess the channel material 112 along sidewalls of the trench 12) selective to the dummy fill, and the dummy fill is removed. In another embodiment, the etch can be performed using a self-aligned reactive ion etch (RIE), which is selective to the channel material 112 to remove the channel material 112 from a bottom of the trench 12, a top of the dielectric of the spacers 104 and recess the channel material 112 along sidewalls of the trench (e.g., spacers 104). A gate or reservoir 106 is formed over the electrolyte 114. The gate 106 can deposited and then planarized (e.g., by chemical mechanical polishing (CMP) to the spacers 104).

In one embodiment, the device 10 can include an ECRAM device. The device 10 can employ electrochemical processes in a switching medium to store information. For example, the device 10 can utilize electron or ion intercalation to alter the charge of the channel 112 to control conductance or resistance across the channel 112. The intercalation can provide analog variation to the conductance or resistance that can be set in an analog fashion for neuromorphic computing.

The channel 112 can include a channel material on the substrate 100 between the source and drain electrodes 102. As current travels from a source/drain electrode 102 to another source/drain electrode 102 through the channel 112, resistance through the channel 112 can be determined. The reading of the resistance can be employed for, e.g., reading stored weights for neuromorphic computing applications. The resistance for, e.g., a stored weight, in the channel 112 can be set by intercalating charge species, such as, e.g., electrons and ions, into the channel 112 from the electrolyte 114. The electrolyte 114 provides a source of charge that can be introduced into the channel 112 to change the charge of the channel 112. A greater degree of intercalation of charge carriers increases the conductance and decreases the resistance of the channel 112. In some cases, removing ions from the channel increases the charge carrier density and reduces the resistance (e.g., in a Li/LCO system).

The channel 112 includes a material that can accept the charge carriers by intercalation, thus varying resistance of the channel material. Examples of some channel materials according to embodiments of the present invention include, but are not limited to, materials that with a high resistance prior to charge carrier intercalation, and relatively lower resistance after intercalation, such as, dielectric materials including, e.g., metal oxides, such as tungsten oxide ($WO_3$), or other suitable channel materials can be employed.

The electrolyte 114 can include a material suitable for donating electrons or ions to the channel 112 including gels and solids. Such electrolytes 114 can include, e.g., lithium (Li) based electrolytes that donate Li under a voltage bias between electrodes 102. For example, electrolyte 114 materials can include, but are not limited to, ionic materials or other solid crystal structures where ions can hop to maintain a flow of ions similar to that which occurs in a liquid electrolyte. In one example, electrolyte 114 can include one or more of LiPON, LiPS, LiPSO, LiSiPSCl, LiGePS, LiSnPS, Li(SiGe)PS, Li(SiSn)PS, LiGePSO, among others. However, an electrolyte based on ions other than Li is also contemplated, e.g., other metal oxides. In other embodiments, any electrolytic materials can be employed suitable for the given applications.

Intercalation of charge species from the electrolyte 114 to the channel 112, and from the channel 112 into the electrolyte 114, can be performed by a voltage difference between the electrolyte 114 and the channel 112. To create the voltage difference, a gate electrode 106 can be used. The gate electrode 106 is disposed on the electrolyte 114 opposite the channel 112. A voltage difference between the gate electrode 106 and the source/drain regions 102 can cause the flow of charge carriers between the electrolyte 114 and the channel 112, thus modulating the stoichiometry and carrier density of the channel material. By changing the stoichiometry and carrier density of the channel 112, the resistance of the channel 112 is modulated in a corresponding fashion.

The gate electrode 106 includes conductive materials, such as, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further include dopants that are incorporated during or after deposition and serve as reservoir for ionic species exchanged with the channel material 112.

The source/drain electrodes 102 may include any suitable conductive material, such as polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

A voltage difference between the gate electrode 106 and one or more of the source/drain regions 102 can be used to set a resistance of the channel 112. A voltage difference between the source/drain regions 102 can then be used to read the resistance of the channel 112. Accordingly, values, such as, e.g., weight values for neuromorphic computing, can be stored and read in the channel 112.

The electrolyte 114 can be a reactive material (reactive electrode) that degrades when exposed to, e.g., air or another ambient environment. The degradation of the electrolyte 114 can inhibit the performance of the device 10 by decreasing the amount of charge carriers. Thus, sealing off the electrolyte 114 from a degrading environment can facilitate device performance throughout the life of the device 10.

The electrolyte 114 can be sealed by forming an encapsulation. The encapsulation can include, e.g., spacers 104 on ends of the channel 112. The spacers 104 can be vertical spacers relative to a horizontal substrate 100 and formed on the source/drain regions 102 up to the gate electrode 106 to form a barrier between the sidewalls of the channel 112 and an ambient environment.

By making a width W of the spacer 104 less than the width of the source/drain regions 102, a greater surface area of the source/drain regions 102 is in contact with the channel 112. A greater surface area for contact can reduce the contact resistance between the channel 112 and the source/drain regions 102. The width W of the spacers 104 can span the distance between adjacent devices or be tailored as needed.

The spacers 104 can seal the electrolyte 114 without shorting the gate electrode 106 with the source/drain regions 102. Thus, according to an embodiment, the spacers 104 can be formed from an insulating material that is protective of the electrolyte 114 from an ambient environment, but will not degrade or form an electrical connection between the gate electrode 106 and the source/drain regions 102. For example, the spacers 104 can include, e.g., a dielectric material, including, but not limited to, silicon oxide (SiO), silicon nitride (SiN), a high-K dielectric material, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In one embodiment, the gate electrode 106 and electrolyte 114 can be covered by a suitable dielectric material (e.g., the same as spacers 104) that can extend over the gate electrode 106 and electrolyte 114 from spacer 104 to spacer 104 on opposite sides of the device 10.

Figure 2:
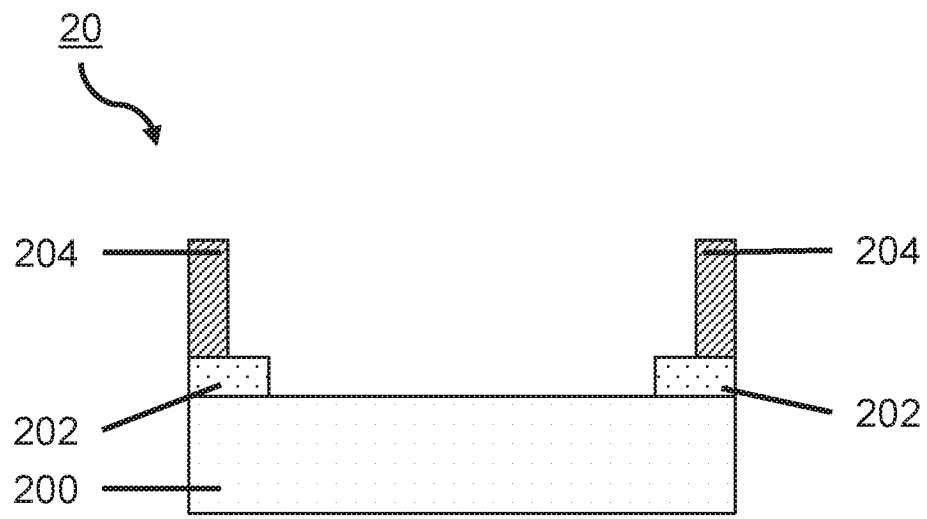
FIG. 2 is a cross-sectional view showing a substrate with source/drain electrodes patterned and spacers or a trench formed thereon for an electrochemical switching device in accordance with one embodiment of the present invention.

Referring to FIG. 2, a cross-sectional view of a substrate with source/drain contacts and spacers 204 for an electrochemical switching device with spacer encapsulation is depicted according to one embodiment of the present invention. Source/drain electrodes 202 are formed on or in a substrate 200. The substrate 200 can include materials or structures such as those described above. Similarly, the source/drain electrodes 202 can have the same or different materials from those described above.

The source/drain electrodes 202 are deposited on the substrate and patterned using a suitable mask and etch process to form the electrode pattern across the substrate 200. The locations of the source/drain regions 202 and the space therebetween correspond to a channel length for a device 20. Forming the source/drain regions 202 can include, e.g., depositing a source/drain material and patterning the material using, e.g., photolithography.

"Deposition" is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RT-CVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, among others.

The patterned source/drain regions 202 can be formed using photolithography and etch process steps. Specifically, a pattern is produced by applying a photoresist to the surface to be etched; exposing the photoresist to a pattern of radiation; and then developing the pattern into the photoresist utilizing resist developer. Once the patterning of the photoresist is completed, the sections covered by the photoresist are protected while the exposed regions are removed using a selective etching process that removes the unprotected regions. Other patterning techniques can also be employed.

The between the source/drain regions 202 can be bounded to define a channel region where a channel structure can be formed. Because the structure may include an electrolyte that is reactive to the environment, the region or area can be defined by spacers 204 that form barriers at each opposing end of a channel region to the environment. The spacers 204 can be patterned over the source/drain regions 202 to facilitate space efficiency by maintaining total device 20 size.

According to an embodiment of the present invention, the spacers 204 can be patterned from a dielectric material. The spacers 204 can include, e.g., any suitable insulating or dielectric material. In one embodiment, the spacers 204 (104, FIG. 1) can be formed by a cured resist process patterned by lithography. The spacers 204 can be cured using electron-beam lithography. For example, silsesquioxane materials, including hydrogen silsesquioxane (HSQ), can be formed with a resolution down to, e.g., about 10 nanometer line widths.

Figure 3:
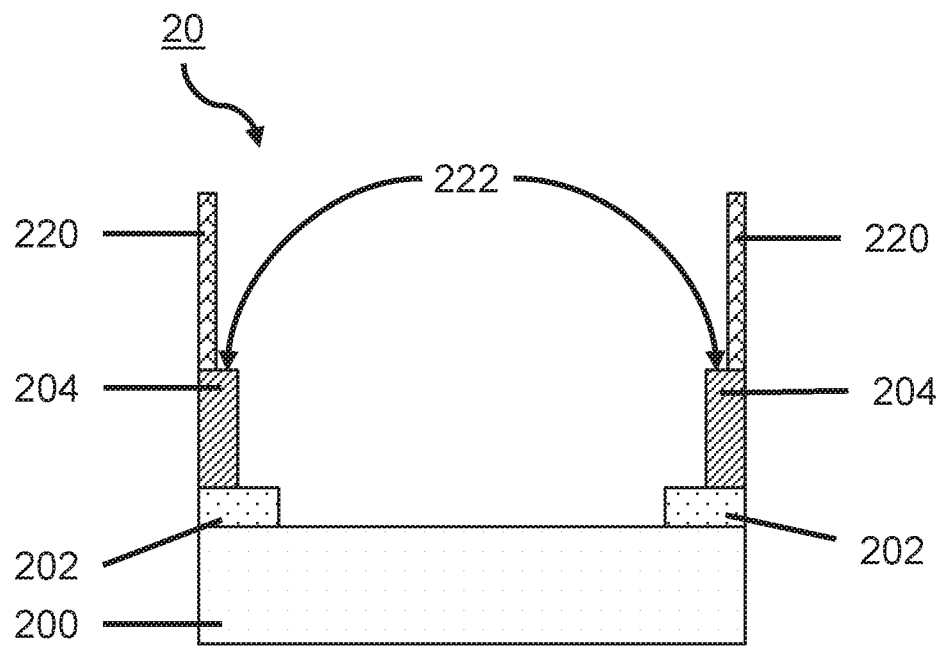
FIG. 3 is a cross-sectional view showing a resist formed on spacers or dielectric material for an electrochemical switching device in accordance with one embodiment of the present invention.

Referring to FIG. 3, a cross-sectional view of a resist on spacers for an electrochemical switching device with spacer encapsulation is depicted according to one embodiment of the present invention. In this embodiment, a nonconformal deposition is employed to form channel material, and electrolytic material. Barriers 220 can be formed over the spacers 204 to further form the enclosure into which the electrochemical device will be formed. Barriers 220 can include a material such as, e.g., poly(methyl methacrylate) (PMMA) or the like. The enclosure or encapsulation facilitates the protection of the device once formed, preventing exposure of the electrolytic materials. The barriers 220 can be formed in a manner similar to the spacers 204. For example, the barriers 220 can include a high resolution lithography process utilizing a high resolution resist. The resist can be deposited across the device 20 and patterned by, e.g., photolithography or electron beam lithography to cure portions of the resist over the spacers 204. The uncured portions of the resist can then be removed by, e.g., etching or other removal process, to leave a pattern of spacers or barriers 220 over the spacers 204.

Due to the lithographic process in curing resists, even high-resolution resists, there may be an overlap region 222 on each spacer 204 where the corresponding barrier 220 leaves a portion of the spacer 204 exposed. The overlap region 222 can be reduced with high resolution curing. The resolution of curing can be improved through the use of high resolution lithography processes and compatible resists, such as, e.g., extreme ultraviolet photolithography, electron beam lithography, among other suitable high resolution lithographic processes. In one embodiment, the overlap region 222 can be employed to achieve pinch off of the electrolyte and channel material using the gate/reservoir material. The overlap region 222 can act with a gate material to encapsulate and seal off the electrolytic material.

Figure 4:
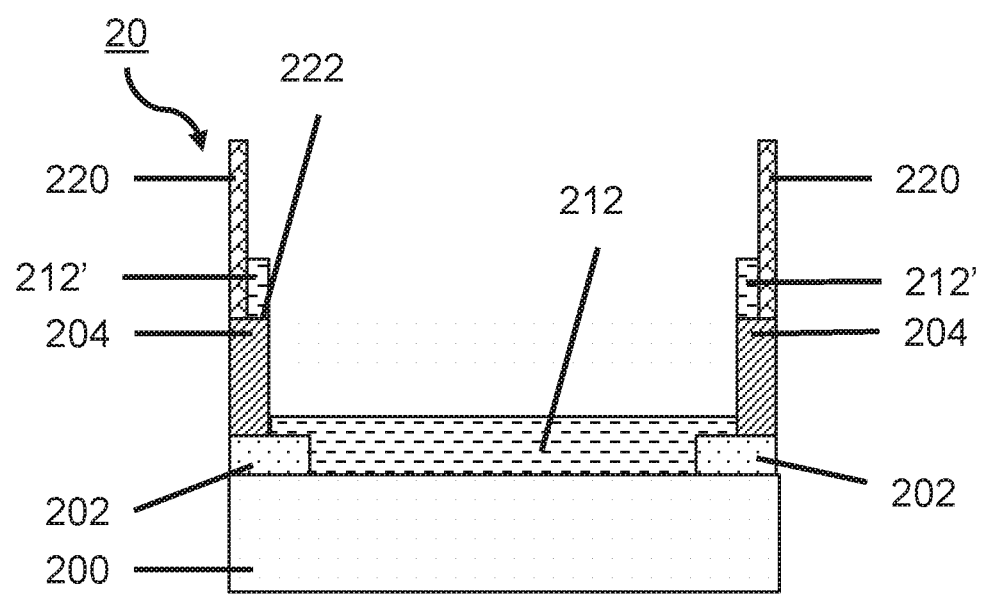
FIG. 4 is a cross-sectional view showing a channel material nonconformally formed on a substrate for an electrochemical switching device in accordance with one embodiment of the present invention.

Referring to FIG. 4, a cross-sectional view of a channel material formed on a substrate for an electrochemical switching device with spacer encapsulation is depicted according to one embodiment of the present invention. A channel material 212 is formed in the channel region between the spacers 204, 220. In the embodiment described, the channel material 212 is deposited by a nonconformal deposition process. The channel material 212 forms a channel between one source/drain electrode 202 and the other source/drain electrode 202 with a conductivity or resistivity corresponding to a concentration of charge species present in the channel material 212. According to embodiments of the present invention, the channel material 212 can be a material that can have the concentration of charge carriers modulated by intercalation. Therefore, the channel material 212 can include, e.g., materials for accepting the intercalated charge carriers, such as the materials described above with reference to the channel material 112. One possible example of a channel material 212 can include, e.g., tungsten oxide (e.g., tungsten trioxide ($WO_3$)).

The channel material 212 can be formed by, e.g., a nonconformal deposition process across the device 20. For example, the channel material 212 can be formed by sputtering, chemical vapor deposition (CVD), plasma enhanced chemical vapor deposition (PECVD), physical vapor deposition (PVD), etc. The deposition of the channel material 212 can result in a layer of the channel material 212 being formed over the spacers 204 in the overlap region 222. The channel material 212 is deposited on horizontal surfaces including the overlap regions 222. The deposition leaves portions 212' of channel material 212.

Figure 5:
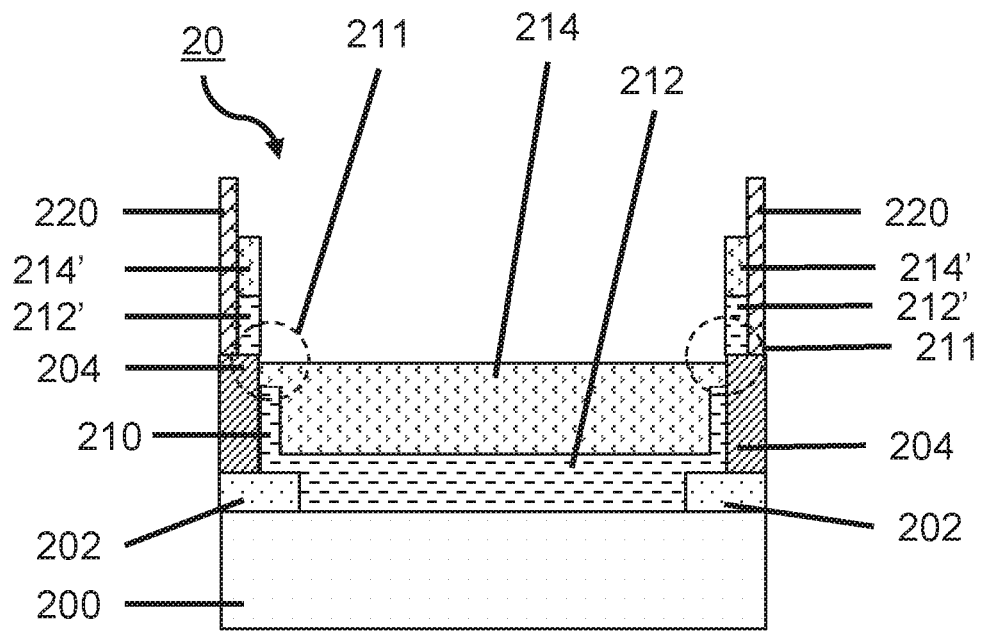
FIG. 5 is a cross-sectional view showing an electrolyte nonconformally formed on the channel material of an electrochemical switching device in accordance with one embodiment of the present invention.

Referring to FIG. 5, an electrolyte 214 can be formed by, e.g., a nonconformal deposition process across the device 20. For example, the electrolyte 214 can be formed by a separate nonconformal deposition processes. The deposition process can include sputtering, chemical vapor deposition (CVD), plasma enhanced chemical vapor deposition (PECVD), physical vapor deposition (PVD), etc. The electrolyte 214 covers the channel material 212 including portions 212' and barriers 220. The electrolyte 214 includes portions 214' of electrolyte 214 on the portions 212'.

Charge carriers can be transferred from the electrolyte 214 to the channel material 212 by an intercalation process. As a result, the channel material 212 can have a resistance or conductance that is modulated by the intercalation of charge carriers from the electrolyte 214. The combination of the electrolyte 214 and the channel material 212 can then be used with electro-chemically modulated characteristics for storing information. Possible materials for an electrolyte 214 include suitable materials for intercalating ions or electrons into the channel material 212, such as, e.g., the materials for the electrolyte 114 described above.

The electrolyte 214 can be deposited to a thickness that is less than a thickness of the spacers 204 over the substrate. The electrolyte 214 may be reactive to the ambient environment. Thus, maintaining a top surface of the electrolyte 214 below a top surface of the spacers 204 can facilitate blocking the electrolyte 214 from the ambient environment by the spacers 204. However, similar to the channel material 212, the material of the electrolyte 214 can also be formed in an overlap region over the spacers 204 on top of the channel material 212.

Figure 6:
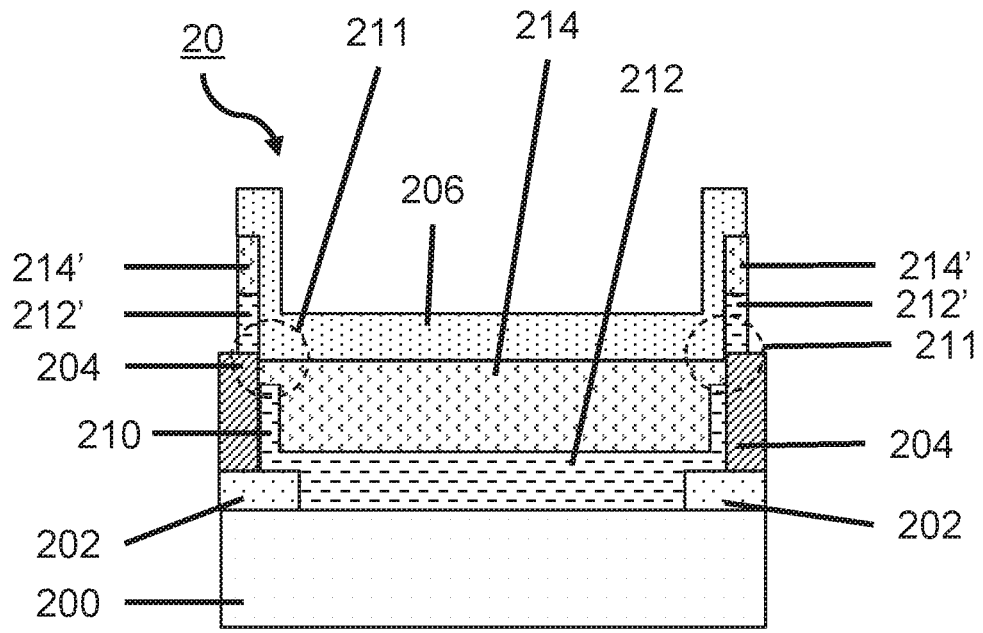
FIG. 6 is a cross-sectional view showing a gate contact disposed on the electrolyte for an electrochemical switching device, the gate contact pinching off the electrolyte so that, along with spacers, an encapsulation of the electrolyte is formed in accordance with one embodiment of the present invention.

Referring to FIG. 6, a gate electrode 206 is formed across the device 20 over the electrolyte 214. According to at least one embodiment, material of the gate electrode 206 is deposited, e.g., blanket deposited or conformally deposited, across the device 20 using a suitable deposition process, e.g., CVD, PECVD, etc. Thus, a layer of conductive material is formed across the device 20, including over the electrolyte 214 in the overlap region 222 over the spacers 204. Moreover, the gate electrode 206 is formed from one spacer 204 to an opposing spacer 204, pinching off the electrolyte 214 of the channel structure 210 from the electrolyte 214 in regions 211 using the spacers 204. Regions 211 will be the location where a pinch off point will be employed to seal off the electrolyte 214 from exposure and complete the encapsulation using the gate 206.

As a result, the gate electrode 206 abuts the spacers 204 on each end to fully encapsulate the electrolyte 214 within a region bounded by the substrate 200, gate electrode 206 on top, and spacers 204 on opposing ends. Thus, the channel structure (electrolyte and channel material) and in particular, the electrolyte 214 is sealed or encapsulated from the ambient environment and protected against degradation. Accordingly, performance and reliability can be improved.

The spacers 204 can be sized (e.g., wider) to provide the barriers 220 sufficient landing area. However, according to an embodiment, the width of the spacers 104 is less than a width of the source/drain regions 202. The spacers 204 can be formed to a greater height above the substrate 100 to permit different sizings of the electrolyte 214 and other components.

The barriers 220 can be removed by, e.g., a liftoff process or a selective etch. The liftoff process can be employed to remove, e.g., PMMA resist (barriers 220) to shape the gate 206 and remove materials formed over the barriers 220. Where the overlap regions 222 exist, the electrolyte 214 and channel material 212 are pinched off in regions 211 between the gate electrode 206 and the spacers 204.

Figure 7:
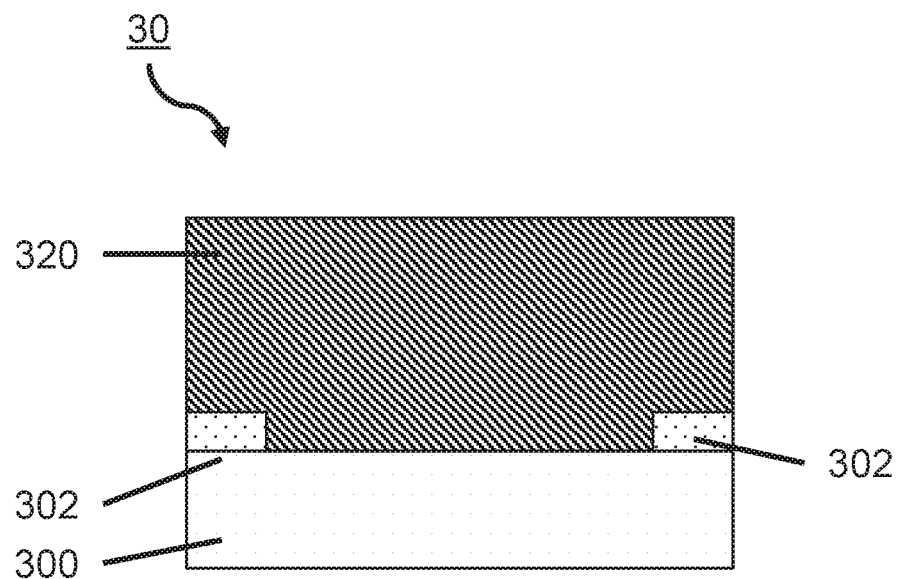
FIG. 7 is a cross-sectional view showing a dielectric layer formed over a substrate for an electrochemical switching device with encapsulation in accordance with one embodiment of the present invention.

Referring now to FIG. 7, a cross-sectional view of a dielectric layer over a substrate for another electrochemical switching device with spacer encapsulation is depicted according to one embodiment of the present invention. In the present embodiment, sidewall spacers are lithographically formed to create a trench for the formation of an electrochemical device. For a device 30, a dielectric material 320 is formed over a substrate 300 with source/drain electrodes 302 or between metal layers in the back-end of a structure (e.g., at higher levels than the substrate). The dielectric 320 includes a material for spacers. Thus, the dielectric 320 is deposited to a thickness over the substrate 300 corresponding to a thickness of the spacers over the substrate 300 and source/drain electrodes 302.

The spacers (formed after the device) or trench (formed in a dielectric layer before forming the device) can be employed to encapsulate a channel structure (and in particular an electrolyte) to protect the channel structure from an ambient environment. Thus, the dielectric 320 includes one or more materials to form a barrier between the ambient environment and the channel structure without interfering with the operation of the device 30. As such, the dielectric 320 can include, e.g., silicon oxide ($SiO_2$), silicon nitride (SiN), aluminum oxide ($Al_2O_3$), among other nitrides, oxides, oxynitride materials, and/or any other suitable dielectric layer. The dielectric 320 can include a single layer of dielectric material or multiple layers of dielectric materials. The material layer that provides the dielectric 320 can be formed by a deposition process, such as chemical vapor deposition and/or atomic layer deposition. Alternatively, the material layer that provides the dielectric 320 can be formed using a spin-on process or other suitable process.

Figure 8:
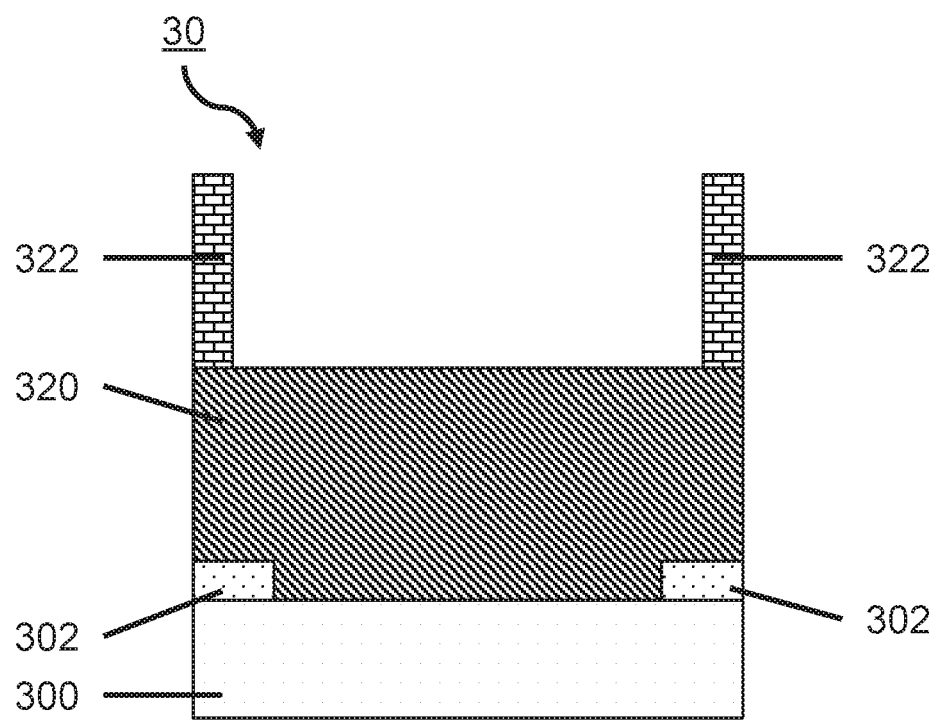
FIG. 8 is a cross-sectional view showing a resist patterned over the dielectric layer for an electrochemical switching device in accordance with one embodiment of the present invention.

Referring now to FIG. 8, a cross-sectional view of a resist patterned over a dielectric layer for an electrochemical switching device with spacer encapsulation is depicted according to one embodiment of the present invention.

According to an embodiment of the present invention, the dielectric 320 is patterned using a mask 322 to form spacers. The mask 322 is formed over the dielectric 320 with a pattern corresponding to a spacer pattern over the device 30. For example, the mask 322 can be patterned to mask regions of the dielectric 320 over the source/drain regions 302 or other structures with a desired width, such as a spacer width.

In one embodiment, following the formation of the layer of dielectric 320, a photolithography and etch process sequence is applied to the material layer for the dielectric 320. Specifically, in one example, a photoresist mask 322 is formed overlying the dielectric 320, in which the portion of the dielectric material that is underlying the mask 322 provides the spacers. The exposed portions of the dielectric 320 which are not protected by the mask 322, are removed using a selective etch process. To provide the mask 322, a photoresist layer is first positioned on the layer of the dielectric 320. The photoresist layer may be provided by a blanket layer of photoresist material that is formed utilizing a deposition process such as, for example, spin-on coating. The blanket layer of photoresist material is then patterned to provide the mask 322 utilizing a lithographic process that can include exposing the photoresist material to a pattern of radiation and developing the exposed photoresist material utilizing a resist developer.

Figure 9:
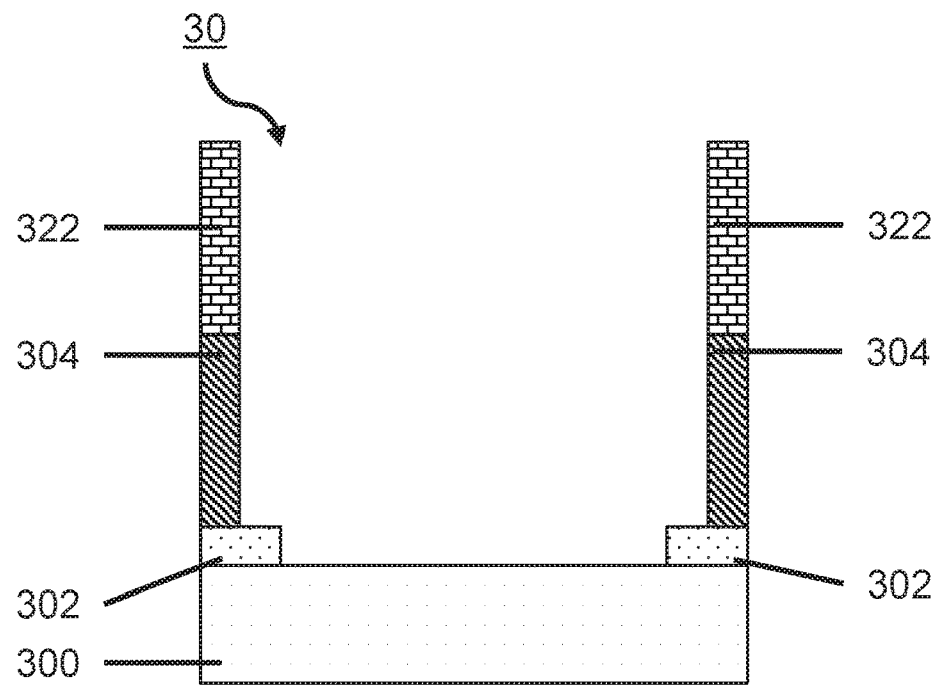
FIG. 9 is a cross-sectional view showing the dielectric layer patterned to form spacers for an electrochemical switching device in accordance with one embodiment of the present invention.

Referring to FIG. 9, a cross-sectional view of a dielectric layer patterned to form spacers for an electrochemical switching device is depicted according to one embodiment of the present invention. Following the formation of the mask 322, an etching process can be employed to remove the unprotected portions of the dielectric 320 selective to the underlying substrate 300 and source/drain electrodes 302 to form spacers 304. For example, the transferring of the pattern provided by the photoresist 322 into the underlying structures can include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present invention include ion beam etching, plasma etching or laser ablation.

Figure 10:
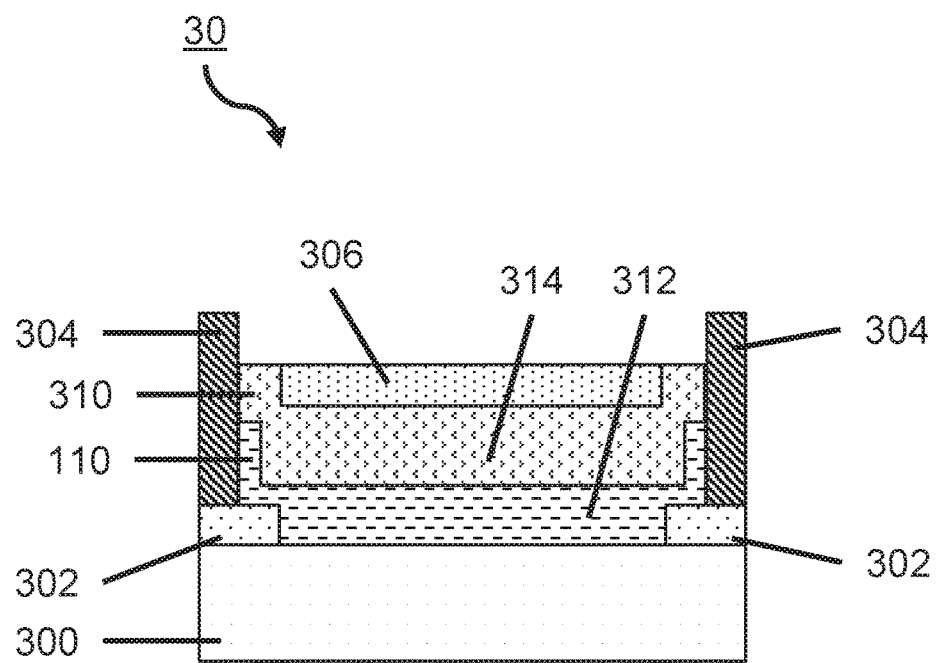
FIG. 10 is a cross-sectional view showing a channel material and electrolyte conformally formed over a substrate or underlying layer for an electrochemical switching device with encapsulation in accordance with one embodiment of the present invention.

Referring to FIG. 10, a cross-sectional view of an electrochemical switching device with spacer encapsulation is depicted according to one embodiment of the present invention. A channel structure is formed between the spacers 304 between the source/drain regions 302 as described above. The channel structure can include, e.g., an electrolyte 314 and a channel material 312, such as the electrolyte and channel material described above. The channel 312 can be conformally formed and recessed to include extension portions 110. The extension portions or extensions 110 can be employed to reduce the possibility of short circuits between the source/drain electrodes 302 and electrolyte 314. The extensions 110 increase a potential leakage path length for charge and provide additional protection against shorting of the electrolyte to the source and drain electrodes 302. Similar extensions can be formed in other layers as well, e.g., in the electrolyte layer to prevent gate leakage to the channel layer, etc. The electrolyte 314 can also be formed using the dummy fill method and recess to form a desired height of electrolyte 314. Alternately, a self-aligned RIE can be employed as described. The electrolyte 314 and the channel material 312 are deposited between the spacers 304 (or between dielectric trench walls, depending on the structure) by a suitable deposition process, preferably a conformal deposition process, such as a conformal CVD or ALD process.

A gate electrode 306 is formed over the channel structure 310 to provide a voltage difference for intercalation of charge carriers between the electrolyte 314 and the channel material 312. The gate electrode 306 can, therefore, include a conductive material, such as, e.g., those described above. The gate electrode 306 is deposited over the device 30 with a suitable deposition process, such as, e.g., CVD.

The channel 312, electrolyte 314 and the gate electrode 306 can be formed over the substrate 300 or other structure to a thickness that is less than a thickness of the spacers 304 over the substrate 300. Thus, the spacers 304 extend above a plane of a top surface of the gate electrode 306 opposite to the substrate 300. By making the spacers 304 extend beyond the top surface of the gate electrode 306, risk of the electrolyte 314 being exposed over the spacers 304 is reduced. The spacers 304 form a barrier against the ambient environment for the electrolyte 314. The spacers 304 are formed to a height that ensures that the ends of the electrolyte 314 are sealed in a space between the substrate 300 on a bottom, the gate electrode 306 on a top, and the spacers 304 on the sides. Accordingly, the electrolyte 314 is protected against degradation to improve device 30 performance and reliability.

Note that the structures described can be achieved, in one embodiment, by forming spacers using thin conformal dielectric deposition followed by self-aligned RIE to remove horizontal portions of the spacer dielectric while leaving dielectric sidewalls to form the spacers 304. In another embodiment, a thick dielectric fill can be blanket-deposited between devices areas and patterned to form trenches. The devices can then be formed within the trenches and a planarization process (e.g., CMP) can be employed to planarize and reveal gate contacts.

Figure 11:
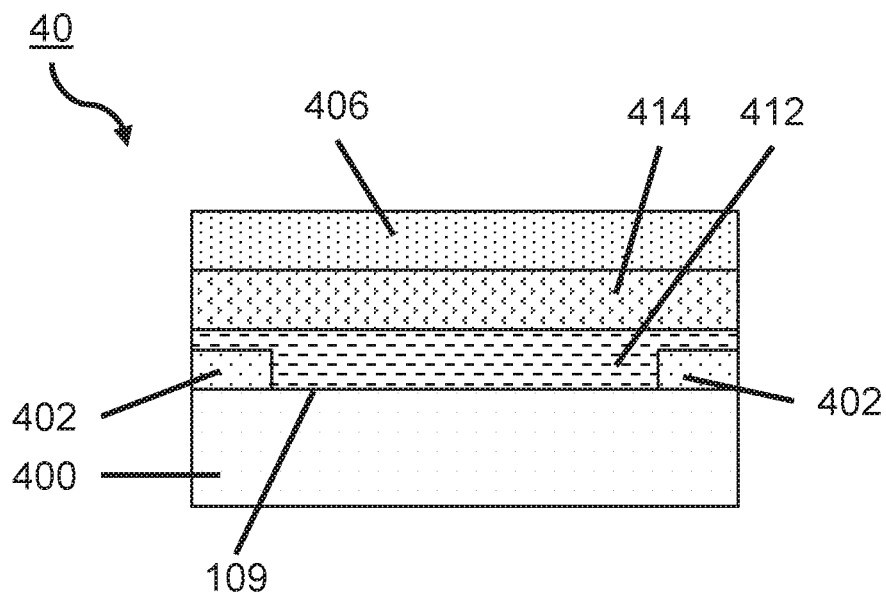
FIG. 11 is a cross-sectional view showing a channel material, electrolyte and gate contact formed over a substrate or underlying layer for an electrochemical switching device in accordance with one embodiment of the present invention.

Referring to FIG. 11, a cross-sectional view of a channel material, electrolyte and gate contact formed over a substrate for an electrochemical switching device with spacer encapsulation is depicted according to one embodiment of the present invention. A device 40 can be formed across a substrate 400 with patterned source/drain electrodes 402. The device 40 can include, e.g., an electrolyte 414 and a channel material 414, such as the electrolyte and channel material described above. Accordingly, the electrolyte 414 and the channel structure 412 can be deposited by a suitable deposition process, as described above.

A gate electrode 406 is formed over the electrolyte 412 to provide a voltage difference for intercalation of charge carriers between the electrolyte 414 and the channel material 412. The gate electrode 406 can, therefore, include a conductive material, such as, e.g., those described above. The gate electrode 406 is deposited over the device 40 with a suitable deposition process, such as, e.g., CVD. The present embodiment described a structure where the electrochemical device is formed and defined followed by an encapsulating structure (e.g., a dielectric) which can form sidewall spacers and/or a top cover if needed.

Figure 12:
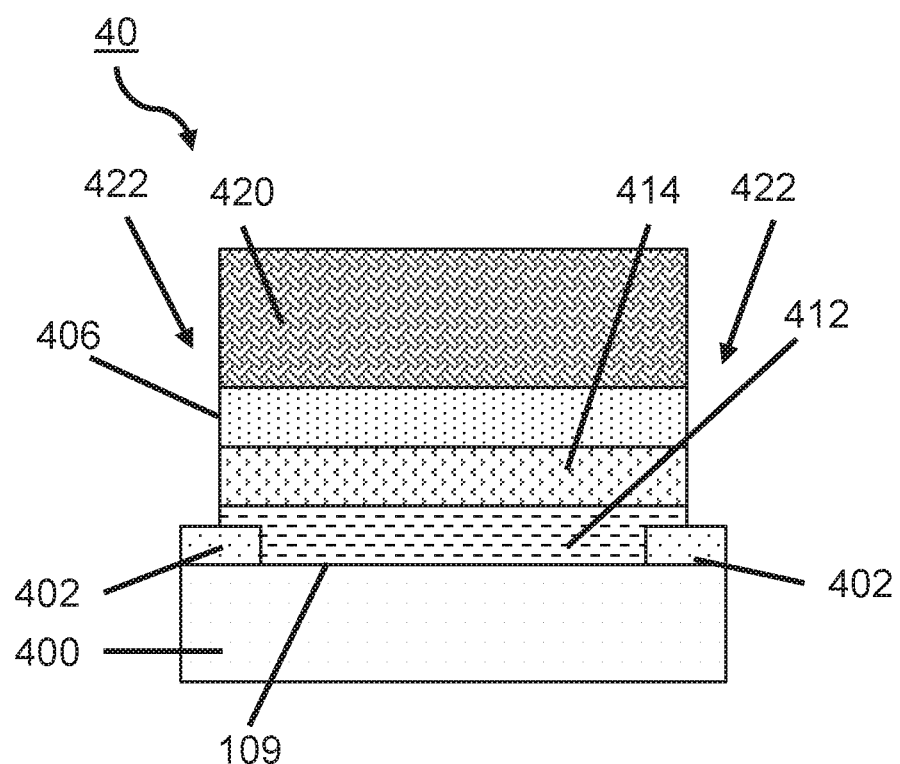
FIG. 12 is a cross-sectional view showing a mask patterned over a gate contact for an electrochemical switching device, the gate contact, electrolyte and channel material being etched in accordance with the mask in accordance with one embodiment of the present invention.

Referring to FIG. 12, a cross-sectional view of a resist patterned over a gate contact and channel structure for an electrochemical switching device with spacer encapsulation is depicted according to one embodiment of the present invention. The gate electrode 406 and the channel structure 410 are patterned using a mask 420 to form recessed portions over the source/drain regions 402. Thus, the mask 420 is formed over the gate electrode 406 with a pattern corresponding to a spacer pattern over the device 40. For example, the mask 420 can be patterned to mask regions of the gate electrode 406, the electrolyte 414 and the channel 412 to be preserved between spacers to be formed. The spacers, and therefore the recessed portions exposed by the mask 420 can be formed to a desired width in accordance with the mask 420.

In one embodiment, following the formation of the layer of the mask 420, a photolithography and etch process sequence is applied to the material layer for the mask 420. Specifically, in one example, a photoresist mask 420 is formed overlying the gate electrode 406, in which the portion of the dielectric material that is not underlying the mask 420 provides the regions for spacers. The exposed portions of the gate electrode 406, the electrolyte 414 and the channel 412 which are not protected by the mask 420, are removed using a selective etch process. The mask layer 420 can be provided as a blanket layer of photoresist material that is formed utilizing a deposition process such as, for example, spin-on coating. The blanket layer of photoresist material is then patterned to provide the mask 420 utilizing a lithographic process that may include exposing the photoresist material to a pattern of radiation and developing the exposed photoresist material utilizing a resist developer.

Following the formation of the mask 420, an etching process is employed to remove the unprotected portions of the gate electrode 406, the electrolyte 414 and the channel 412 selective to the underlying substrate 400 and source/drain regions 402 to form recessed portions 422. For example, the transferring of the pattern provided by the photoresist or other mask into the underlying structures may include an anisotropic etch, e.g., RIE. Other examples of anisotropic etching that can be employed as well.

Figure 13:
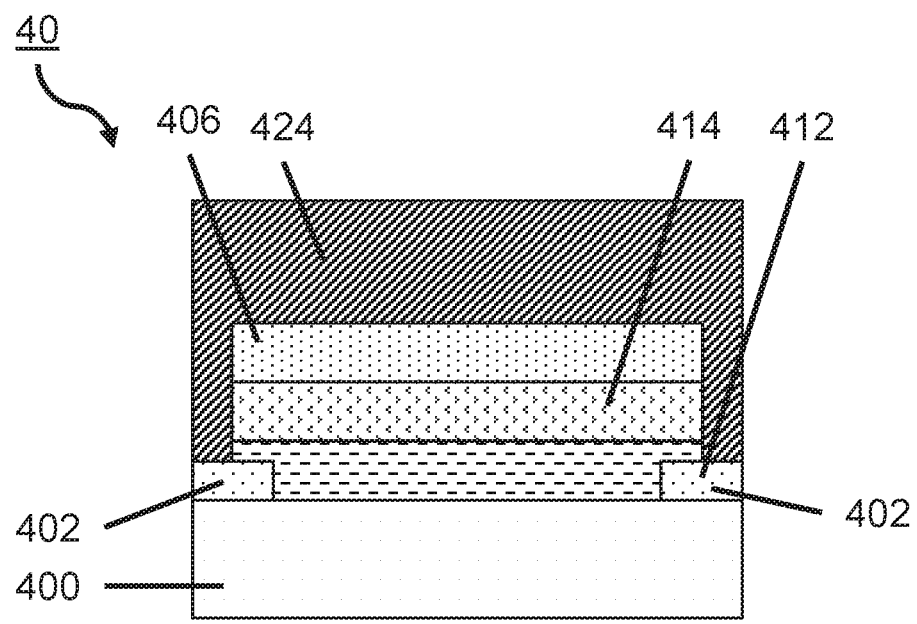
FIG. 13 is a cross-sectional view showing the gate contact, electrolyte and channel material buried in a dielectric material for an electrochemical switching device for forming self-aligned spacers in accordance with one embodiment of the present invention.

Referring to FIG. 13, a cross-sectional view of a dielectric material formed on an electrochemical switching device is depicted according to one embodiment of the present invention. A dielectric 424 is formed across the device 40 to bury the top and sides of the gate electrode 406 and the sides of the electrolyte 414 and the channel 412. The dielectric 424 can include a material for forming spacers, similar to the dielectric 320. As such, the dielectric 424 can include, e.g., silicon oxide ($SiO_2$), silicon nitride (SiN), aluminum oxide ($Al_2O_3$), among other nitrides, oxides, oxynitride materials, and/or any other suitable dielectric layer. The dielectric 424 can include a single layer of dielectric material or multiple layers of dielectric materials. The material layer that provides the dielectric 424 can be formed by a deposition process, such as, e.g., CVD, or other suitable process. In a particularly useful embodiment, the dielectric 424 is blanket deposited so that the recessed portions 422 are filled in a self-aligned filling process.

Figure 14:
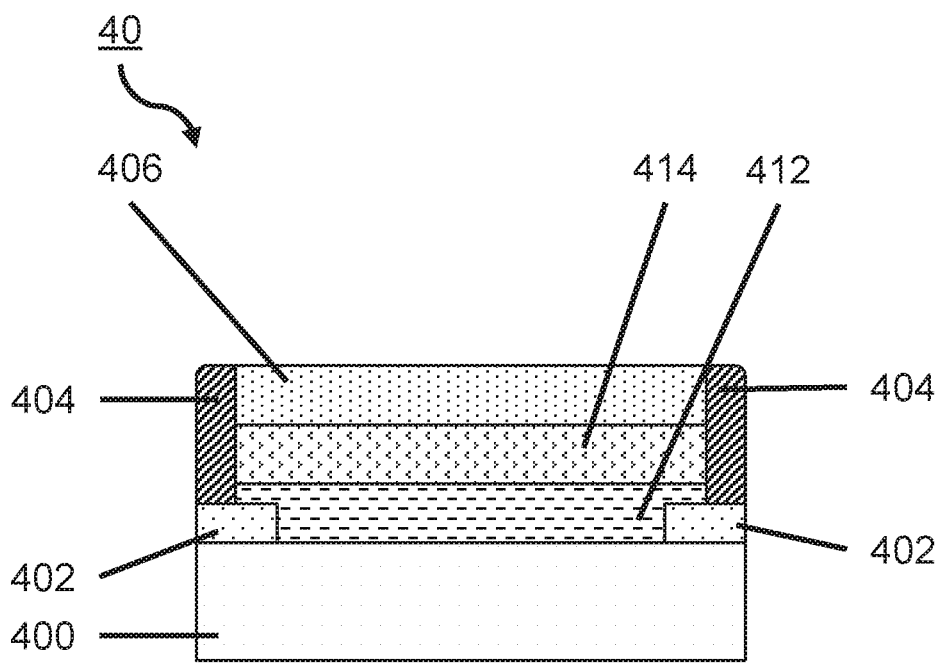
FIG. 14 is a cross-sectional view showing a dielectric material planarized to form spacers for an electrochemical switching device in accordance with one embodiment of the present invention.

Referring to FIG. 14, a cross-sectional view of a self-aligned dielectric material forming spacers for an electrochemical switching device with encapsulation is depicted according to one embodiment of the present invention. Spacers 404 can be formed to seal the electrolyte 414 from an ambient environment, and thus prevent degradation. To produce the spacers 404, the dielectric 424 over the gate electrode 406 can be removed, by e.g., CMP, to leave dielectric material in the recessed portions 422 at ends of the gate electrode 406, the electrolyte 414 and the channel 412. As a result, spacers 404 are left behind capping ends of the channel structure 410 to encapsulate the channel structure 410 in a space bounded by the gate structure 406 on a top, the substrate 400 on a bottom and the spacers 404 on opposing ends.

The dielectric material over the gate electrode 406 can be removed by a planarization process, such as, e.g., CMP, or by an anisotropic etch selective to the gate electrode 406 such as, e.g., RIE. In other embodiments, the dielectric 424 can be conformally deposited and anisotropically etched in a sidewall spacer formation process. The conformal deposition can include a conformal CVD process and the etch can include RIE. The conformal deposition and etch also provides self-aligned spacers 404.

In accordance with the present embodiments, electrochemical devices, such as ECRAM devices are provided. The devices can be disposed on structures that can include a contact, a metal line (e.g., crossbar array line), a substrate (e.g., 100, FIG. 1), a dielectric layer, etc. The structure can be a back-end layer or formed anywhere in a device structure. In some embodiments, a dielectric material is blanket deposited and patterned using lithography or other suitable patterning techniques to form trenches in the dielectric material. The dielectric material can form at least a portion of the encapsulation structure to protect electrolyte materials of the electrochemical devices to be formed. The trenches define the device or cell locations. In other embodiments, encapsulation structures are formed on devices structures to protect electrolyte materials of the electrochemical devices to be formed.

Figure 15:
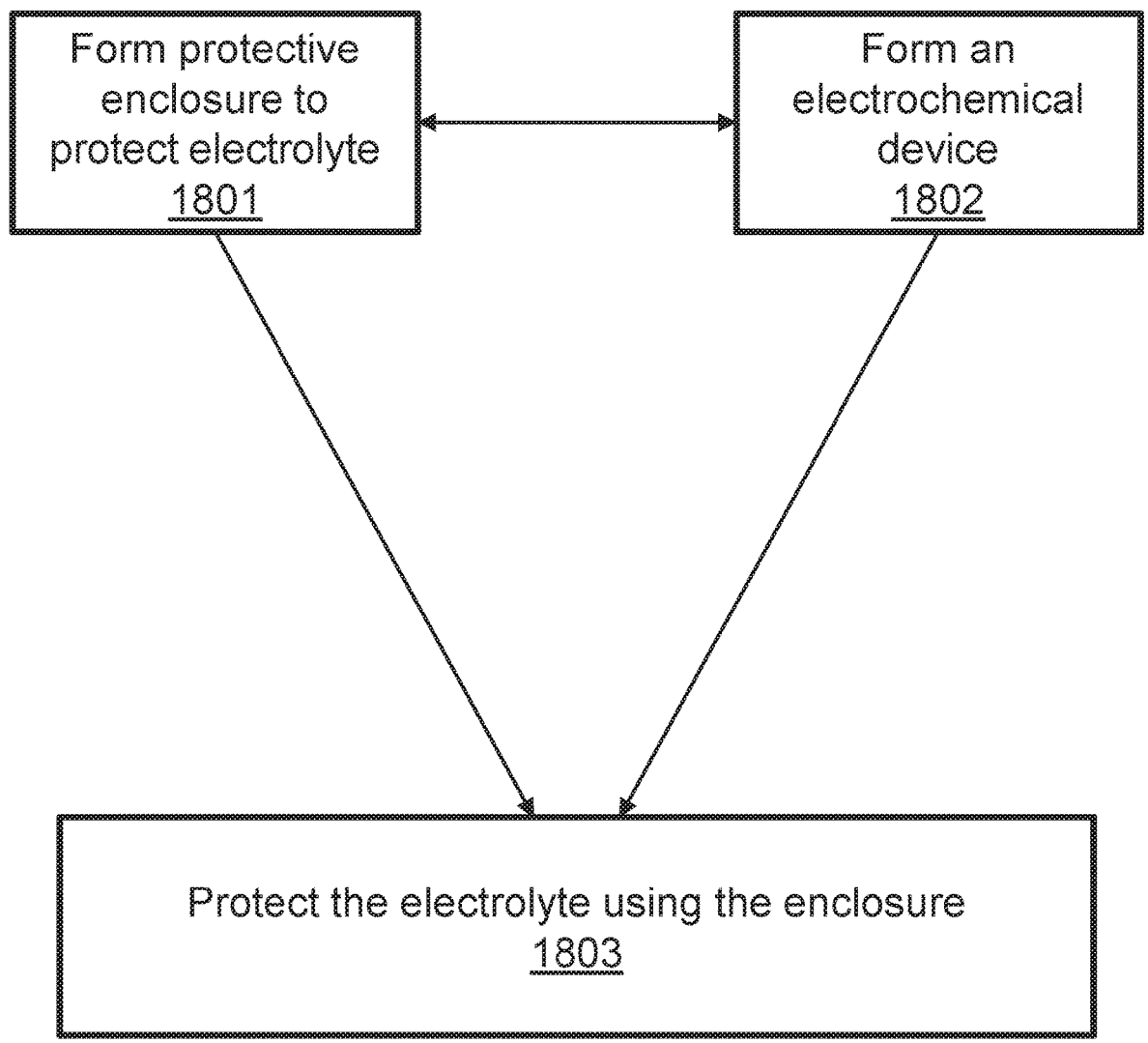
FIG. 15 is a block/flow diagram showing methods for forming an electrochemical switching device with protective encapsulation in accordance with embodiments of the present invention.

Referring now to FIG. 15, a block/flow diagram of a method for forming an electrochemical device with protective encapsulation is depicted according to embodiments of the present invention.

In block 1801, an enclosure is formed to protect electrolyte material of an electrochemical device wherein the enclosure is disposed about the electrolyte material and covers at least vertical sidewalls of the electrolyte material. The enclosure can be formed before, concurrently or after the electrochemical device is formed. The enclosure can include sidewalls in the form of sidewalls spacers. The sidewall spacers can be deposited on source/drain electrodes or directly on a substrate. The spacers can be self-aligned by patterning openings through device layers followed by a dielectric fill process and CMP or etch to remove excess material. Different methods can be employed to surround and protect the electrolyte material, channel material and/or other materials or components of the electrochemical device.

In block 1082, an electrochemical device is formed before, concurrently or after the enclosure is formed. The electrochemical device can include an ECRAM device. A channel material can be formed in the enclosure having optional extension portions that extend vertically upward along the sidewall spacers. A central portion of the channel material can be recessed so that an electrolyte material formed in the recess is closer to the source/drain electrodes in the central portion than at the end portions of the channel layer near the spacers. A central portion of the electrolyte material can also be recessed so that a gate electrode material formed in the recess is closer to the channel material in the central portion than at the end portions of the electrolyte layer near the spacers. The enclosure can include a top portion, such as a gate electrode or a dielectric layer to complete the enclosure.

In block 1803, the electrochemical device is protected from ambient materials using the enclosure. Additional processing can be employed.

Having described preferred embodiments for electrochemical switching devices with protective encapsulation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An electrochemical device, comprising:
an enclosure formed over a structure and defining an area between vertical portions of the enclosure; and
an electrochemical channel structure including an electrolyte formed within the area wherein the electrolyte is protected from exposure on sidewalls of the electrolyte by the enclosure wherein the electrochemical channel structure and the electrolyte are in contact with the vertical portions.

2. The electrochemical device recited in claim 1, wherein the enclosure includes sidewall spacers formed on vertically disposed sides of the electrochemical channel structure.

3. The electrochemical device recited in claim 2, wherein the spacers are self-aligned relative to the electrochemical channel structure.

4. The electrochemical device recited in claim 2, wherein the enclosure includes a gate electrode extending over the sidewall spacers to form a portion of the enclosure.

5. The electrochemical device recited in claim 2, further comprising source/drain electrodes and the sidewall spacers are formed on the source/drain electrodes.

6. The electrochemical device recited in claim 1, wherein the electrochemical channel structure includes a channel material and the electrolyte is formed on the channel material, the channel material including extension portions extending along the vertical portions of the enclosure.

7. The electrochemical device recited in claim 6, wherein the channel material includes an oxide of tungsten.

8. The electrochemical device recited in claim 1, wherein the electrolyte includes a lithium based electrolyte.

9. The electrochemical device recited in claim 1, wherein the electrochemical channel structure is disposed between source and drain electrodes.

10. An electrochemical device, comprising:
a substrate;
source/drain electrodes disposed on the substrate;
a channel material disposed over the substrate and the source/drain electrodes;
an electrolyte disposed on the channel material;
a gate electrode disposed on the channel material; and
an enclosure at least partially encapsulating the electrolyte and having vertical portions to protect the electrolyte from exposure on sidewalls of the electrolyte wherein the electrolyte and channel material are in contact with the vertical portions.

11. The electrochemical device recited in claim 10, wherein the enclosure includes sidewall spacers formed on vertically disposed sides of the electrolyte.

12. The electrochemical device recited in claim 11, wherein the spacers are self-aligned relative to the electrolyte.

13. The electrochemical device recited in claim 11, wherein the gate electrode extends over the sidewall spacers to form a portion of the enclosure.

14. The electrochemical device recited in claim 11, wherein the sidewall spacers are formed on the source/drain electrodes.

15. The electrochemical device recited in claim 10, wherein the channel material includes extension portions extending along the vertical portions of the enclosure to reduce potential shorts between the electrolyte and the source/drain electrodes.

16. The electrochemical device recited in claim 10, wherein the channel material includes an oxide of tungsten and the electrolyte includes a lithium based electrolyte.

17. The electrochemical device recited in claim 10, wherein the enclosure includes a material selected from the group consisting of SiN, AlO and SiO.

18. A method for forming an electrochemical device, the method comprising:
   forming an enclosure to protect electrolyte material of an electrochemical device wherein the enclosure is disposed about the electrolyte material and covers at least vertical sidewalls of the electrolyte material and channel material; and
   protecting the electrochemical device from ambient materials using the enclosure.

19. The method as recited in claim 18, wherein forming the enclosure includes depositing a gate electrode on the electrolyte to further encapsulate the electrolyte material.

20. The method as recited in claim 18, wherein forming the enclosure includes forming self-aligned spacers to cover the at least vertical sidewalls of the electrolyte material.

* * * * *